(12) United States Patent
Lee

(10) Patent No.: US 9,582,614 B2
(45) Date of Patent: Feb. 28, 2017

(54) METHOD AND SYSTEM FOR SITE AND BUILT ENVIRONMENT INFORMATION MODELING AND MANAGEMENT

(71) Applicant: TORTI GALLAS AND PARTNERS CHK, INC., Silver Spring, MD (US)

(72) Inventor: Joowan Lee, Chevy Chase, MD (US)

(73) Assignee: TORTI GALLAS AND PARTNERS CHK, INC, Silver Springs, MD (US)

( * ) Notice: Subject to any disclaimer, the term of this patent is extended or adjusted under 35 U.S.C. 154(b) by 858 days.

(21) Appl. No.: 13/752,166

(22) Filed: Jan. 28, 2013

(65) Prior Publication Data

US 2013/0197873 A1 Aug. 1, 2013

Related U.S. Application Data

(60) Provisional application No. 61/591,746, filed on Jan. 27, 2012.

(51) Int. Cl.
G06F 17/50 (2006.01)
G06T 19/00 (2011.01)

(52) U.S. Cl.
CPC .......... *G06F 17/50* (2013.01); *G06F 17/5004* (2013.01); *G06T 19/00* (2013.01)

(58) Field of Classification Search
CPC ...................................................... G06T 19/00
USPC ............................................................. 703/1
See application file for complete search history.

(56) References Cited

U.S. PATENT DOCUMENTS

2011/0029897 A1* 2/2011 Russell .......................... 715/757

OTHER PUBLICATIONS

Benjaoran et al.: An integrated safety management with construction management using 4D CAD model; Safety Science 48 (2010) 395-403.*

* cited by examiner

*Primary Examiner* — Hugh Jones
(74) *Attorney, Agent, or Firm* — Arent Fox LLP

(57) ABSTRACT

System, methods, and apparatus, are described herein for modeling a site, such as a construction site. The site may include, for example, adding a new building to an existing city block, remodeling a building, re-developing an entire city/town, etc. Data may be gathered representing the site from a plurality of sources, and the data gathered may be used to determine how the new development affects the existing site. An interactive model may be generated that enables a user to walk through the site to visualize what the site will look like when completed. Hyperlinks to additional details about elements in the site may be provided.

13 Claims, 8 Drawing Sheets

METHOD AND SYSTEM FOR SITE AND BUILT ENVIRONMENT INFORMATION MODELING AND MANAGEMENT

CLAIM PRIORITY UNDER 35 U.S.C. §119

The present Application for Patent claims priority to U.S. Provisional Application No. 61/591,746 entitled "Method and System for Town Information Modeling" filed Jan. 27, 2012, which is expressly incorporated by reference herein.

BACKGROUND

Background

When building new structures or remodeling additional structures within a site or built environment, such as adding a new building to a city block or performing a complete town/block redevelopment, models are typically used to represent the site. Some typical models are two-dimensional architectural drawings showing the placement of the new developments. Others may include a three-dimensional, small scale replica of the site. However, none of the typical models enable a user to visualize moving through the site, with the surroundings changing as the user moves through the site, showing the impact of new developments. Moreover, none of the typical models are able to present a user with additional data, upon request, for elements, such as building capacity and zoning requirements, within the site.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In accordance with some aspects, methods and apparatus for site modeling are described herein that include receiving data representing an existing site; analyzing the data representing the existing site to determine an impact of new development at the existing site; and building a model to visually present a representation of the existing site incorporating the new development.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

Figure 1:
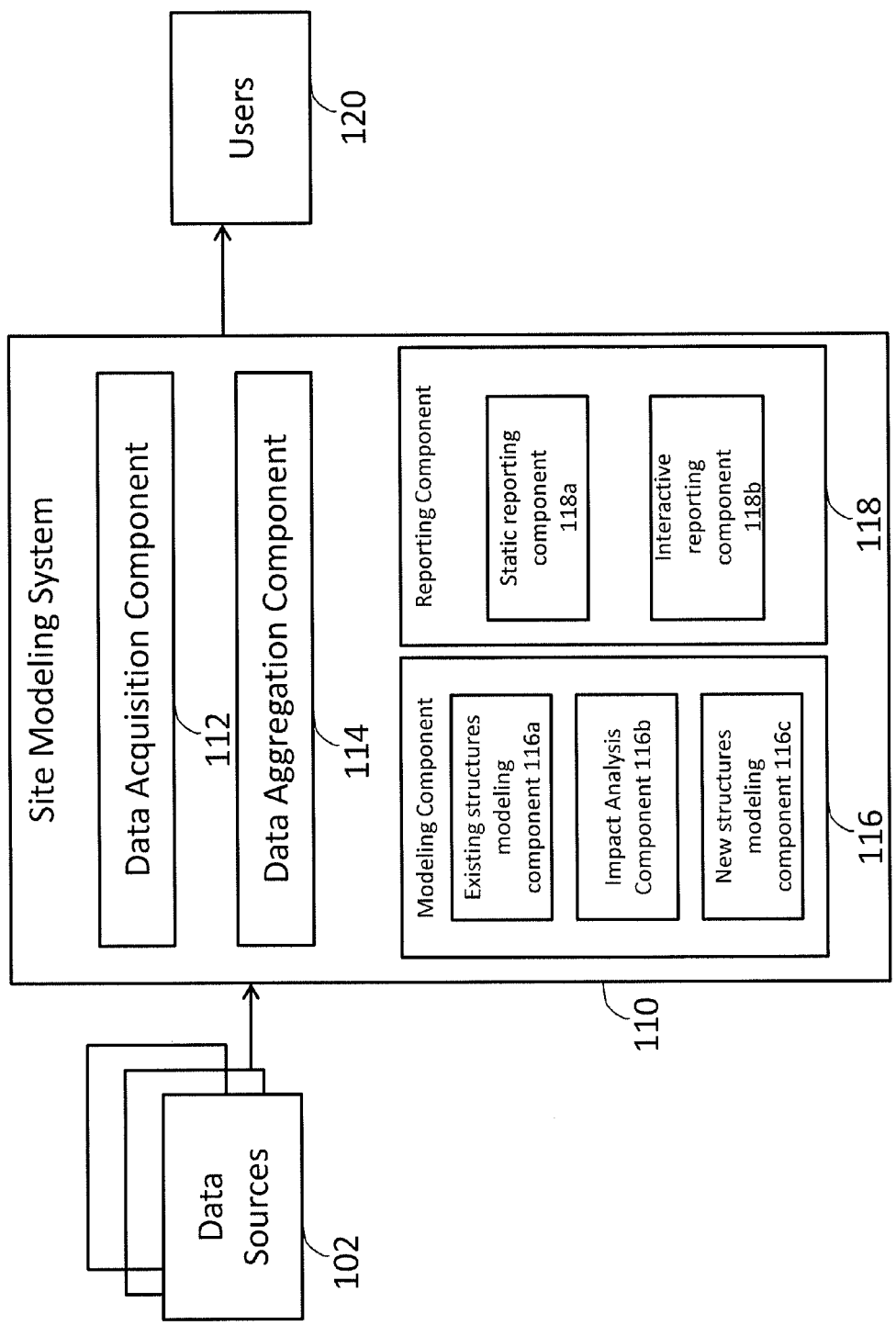
FIG. 1 is a block diagram illustrating an example of a site modeling system, in accordance with some aspects.

System, methods, and apparatus, are described herein for modeling a site or built environment, such as a construction site. The site or built environment may include, for example, adding a new building to an existing city block, remodeling a building, re-developing an entire city/town, etc. The aspects described herein are configured to gather data representing the site from a plurality of sources, and use the data gathered to determine how the new development affects the existing site. In accordance with some aspects, an interactive model is generated that enables a user to step through the site to visualize what the site will look like after the new development has been completed. In some aspects, hyperlinks to additional details about elements in the site may be provided.

Various aspects are now described with reference to the drawings. In the following description, for purposes of explanation, numerous specific details are set forth in order to provide a thorough understanding of one or more aspects. It may be evident, however, that such aspect(s) may be practiced without these specific details.

As used in this application, the terms "component," "module," "system" and the like are intended to include a computer-related entity, such as but not limited to hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches may also be used.

Referring now to FIG. 1, a high-level functional block diagram of a site modeling system is shown, in accordance with some aspects of the disclosure. As shown in FIG. 1, a site modeling system 110 may include a data acquisition component 112 for acquiring data relevant for modeling a site. Data acquisition component 112 may be configured to acquire data from a plurality of data sources, such as data sources 102. Data sources 102 may include, for example, geospatial databases, surveyor data, architectural plans, photographs, mapping databases, and/or any other source having data relevant to the site. The acquired data may include data related to existing structures within and adjacent to a planned site, as well as data related to new structures to be included in the site.

As described above, data may be collected from a plurality of sources, such as data sources 112. Data aggregation component 114 may be configured to aggregate the collected data in a more user-friendly manner. For example, in some aspects, data may be organized based on the structure to which the data relates. In other aspects, data may be organized by source, extracting only those portions of the data that are relevant to the site. Other data aggregation techniques may also be applied.

As shown in FIG. 1, site modeling system 110 may also include a modeling component 116 that may include an existing structure modeling component 116a, an impact analysis component 116b, and a new/revised structure modeling component 116b. In some aspects, existing structure modeling component 116a may be configured to model the existing structures, features, topography, etc., on or near a proposed site. For example, existing structure modeling component 116a may be configured to first build the existing topography based on, for example, maps, surveyor data, photographs, design plans, etc. Building the existing topography may include illustrating, in geographically correct locations, any buildings, trees, mountains, parking lots, bodies of water, pedestrian walkways, etc., that are currently a part of an existing site. In some aspects, information for topographical elements within a defined radius, or that include key, well-known structures, may also included in the existing topography, even if outside of the boundaries of the site to be improved.

Impact analysis component 116b may be configured to consider the existing topography, the site developer's requirements, any zoning ordinances or other laws (local, state, federal) regarding land use, and/or other information to determine the effect of placement of proposed new structures, or re-modeling of existing structures. Impact analysis component 116b may be configured to coordinate the location of new structures into an existing site. This may include, for example, determining how the potential additions affect any existing physical structures, parking lots, etc. According to some aspects, impact analysis component 116b may also consider any dependencies a proposed additional structure may have on existing structures.

Revised structure modeling component 116c may be configured to generate a model of the site including any additional structures or revisions to existing structures. Modeling component 116c may generate a model representing optimal placement of structures based on the analysis performed by analysis component 116b.

Site modeling system 110 may also include a reporting component 118 for generating output to be provided to users 120. Reporting component 118 may include a static reporting component 118a for generating one or more reports related to the site analysis. Reports may include, for example, a model showing the new site elements integrated with existing elements, detailed information about each site element (e.g., building capacity, size, zoning requirements, etc.), photographs of existing elements, an analysis of any impact the new structures may have on the existing site, shadow studies, and/or any other compiled information relevant to the site.

In accordance with some aspects, reporting component 118 may also include an interactive component 118b for generating and providing interactive site modeling information to a user. For example, the interactive component 118b may provide a virtual mode of the site that enables a user to "experience" the site in real time. An avatar representing the user may move through the site. As the avatar moves, the view changes, giving a user a realistic view of what the user would see when moving through the actual site after it has been completed. In some aspects, the interactive model is created to correctly reflect the geography, time zones, time of day, etc., associated with the site. For example, the user may be presented with an option to select a time of day the user wishes to experience. The user may then be presented with a model that shows the conditions at that time of day. For example, the model may show any shadows associated with the placement of the sun at the selected time of day, typical traffic patterns present at the time of day, etc.

Figure 2:
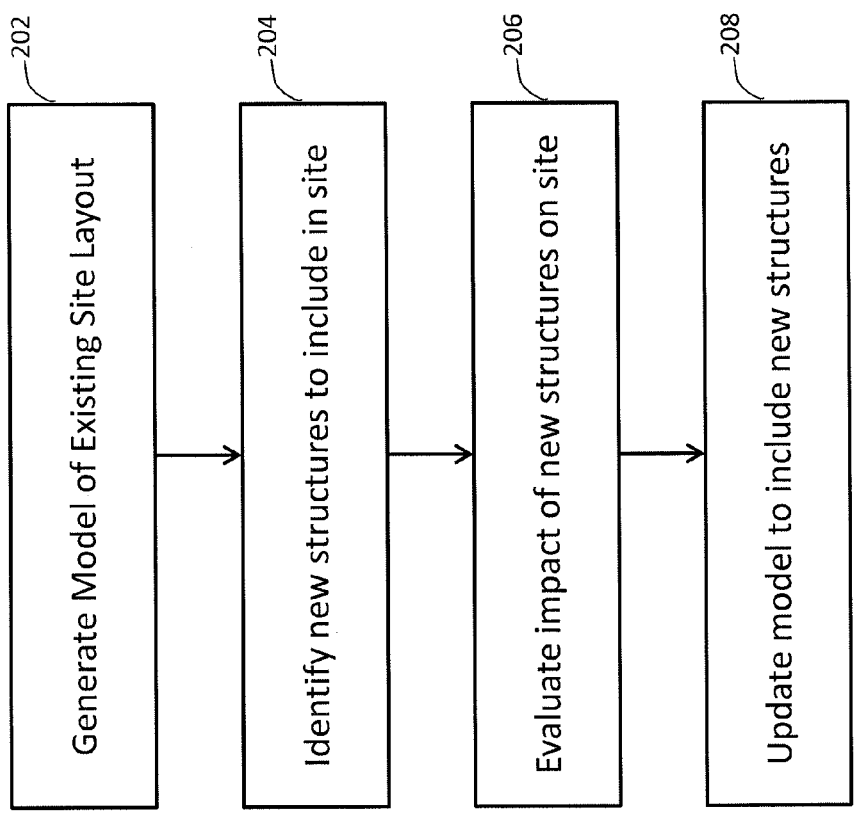
FIG. 2 is an example of a method for modeling a site, in accordance with some aspects.

Referring now to FIG. 2, a method 200 for modeling site information is described. As shown at 202, a model of an existing layout associated with a subject site may be prepared. The existing layout may include buildings, structures, topographical elements, natural elements, etc., located within or near the subject site. In some aspects, preparing the model of the existing layout may be based on data obtained from one or more sources such as, for example, maps, photographs, site plans, surveyor results, etc., describing the existing layout.

As shown at 204, one or more new structures to be incorporated into the site may be identified. The new structures may include new buildings, renovation of older buildings, etc. Information about the new structures may be obtained from a plurality of sources, such as, for example, building specifications, design documents, etc. As shown at 206, an evaluation of the impact of the new structures to the existing structures may be performed. As shown at 208, the model may be updated to include the new structure(s).

Figure 3A:
FIGS. 3A and 3B present examples of existing and revised models, in accordance with some aspects.
Figure 3B:
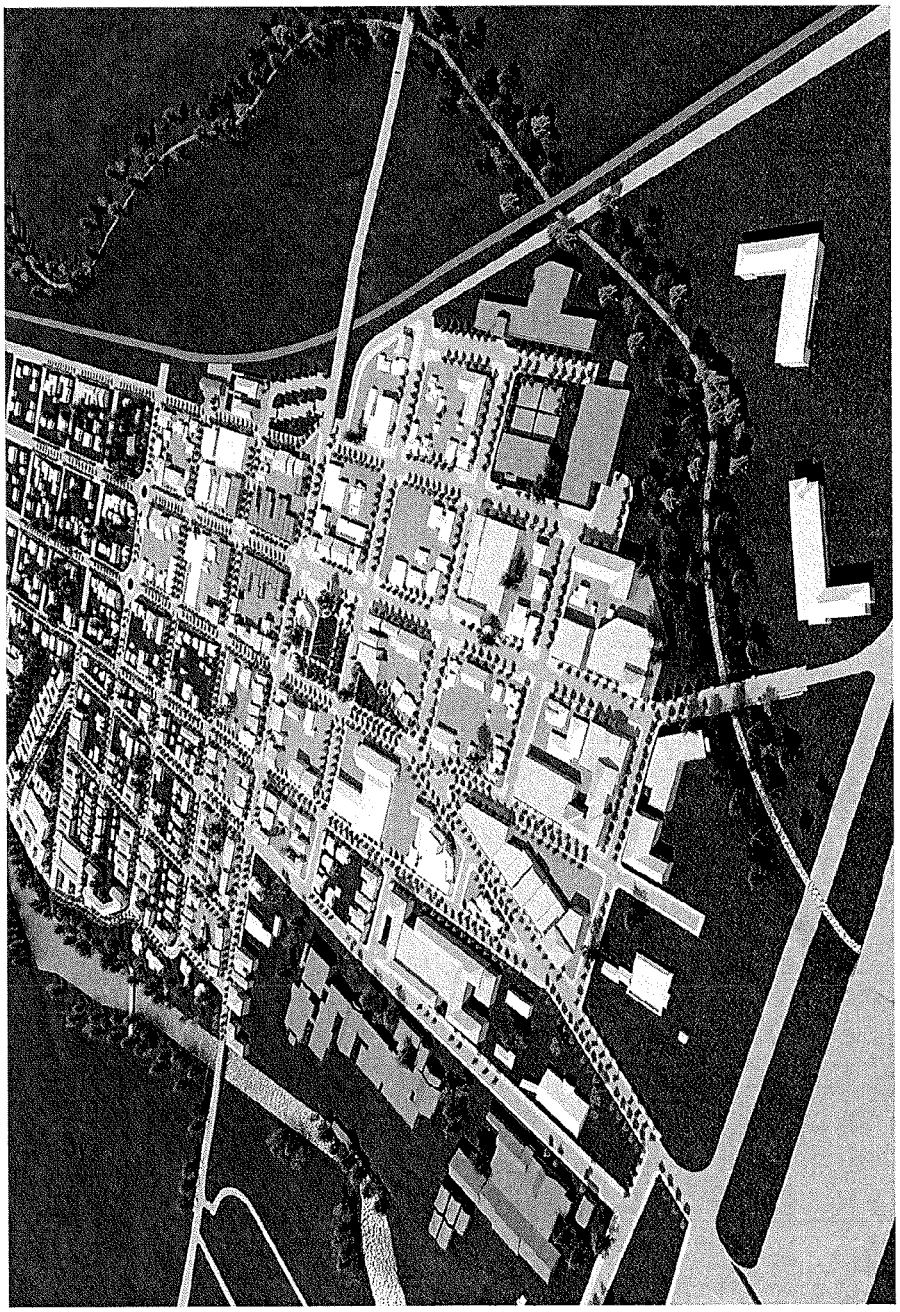

FIG. 3A is an example of a site plan representing existing elements on and in proximity to a proposed site plan. As shown in FIG. 3, the existing site is sparsely populated. FIG. 3B is an example of a modified site plan including a plurality of additions to the site, which shows how the landscape has changed with the addition of the new structures.

Figure 4:
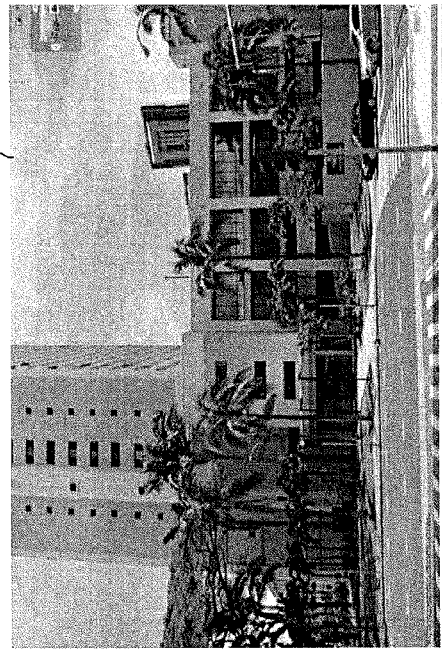
FIG. 4 depicts an example of hyperlinks associated with a model element, in accordance with some aspects.
Figure 4:
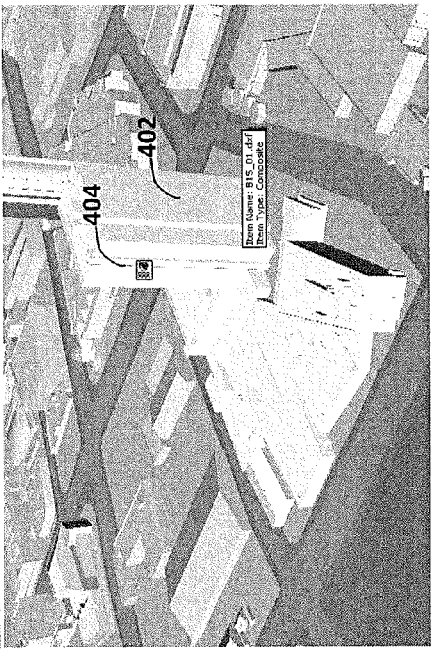

As described above, in some aspects, interactive models may be provided, enabling virtually experience the site. In some aspects, one or more hyperlinks may be associated with elements in a site plan. FIG. 4 is an example of an element having a hyperlink associated therewith. As shown in FIG. 4, a building 402 has a hyperlink 404 associated therewith. When a user selects the hyperlink 404, one or more data files may be opened. For example, in the example shown in FIG. 4, a photograph 406 of building 402 is displayed as well as a table of data 408 describing features of the building. Any other types of information may also be associated with hyperlink 404 and displayed upon selection of hyperlink 404.

Figure 5:
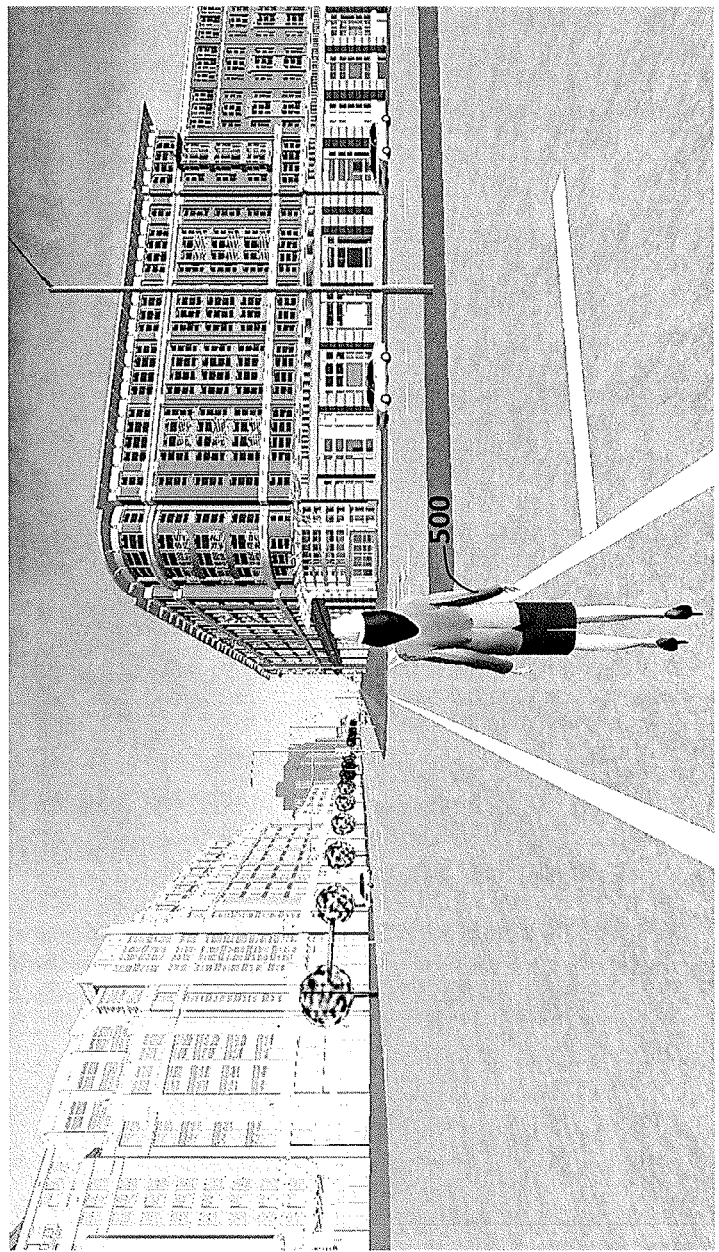
FIG. 5 depicts an example of a virtual model, in accordance with some aspects.

Referring now to FIG. 5, in accordance with some aspects, an avatar 500 may be provided for exploring an interactive model. The views, elevation, etc., change as the avatar 500 navigates the site, enabling a user to visualize what the user would see if actually walking through the completed site.

Figure 6:
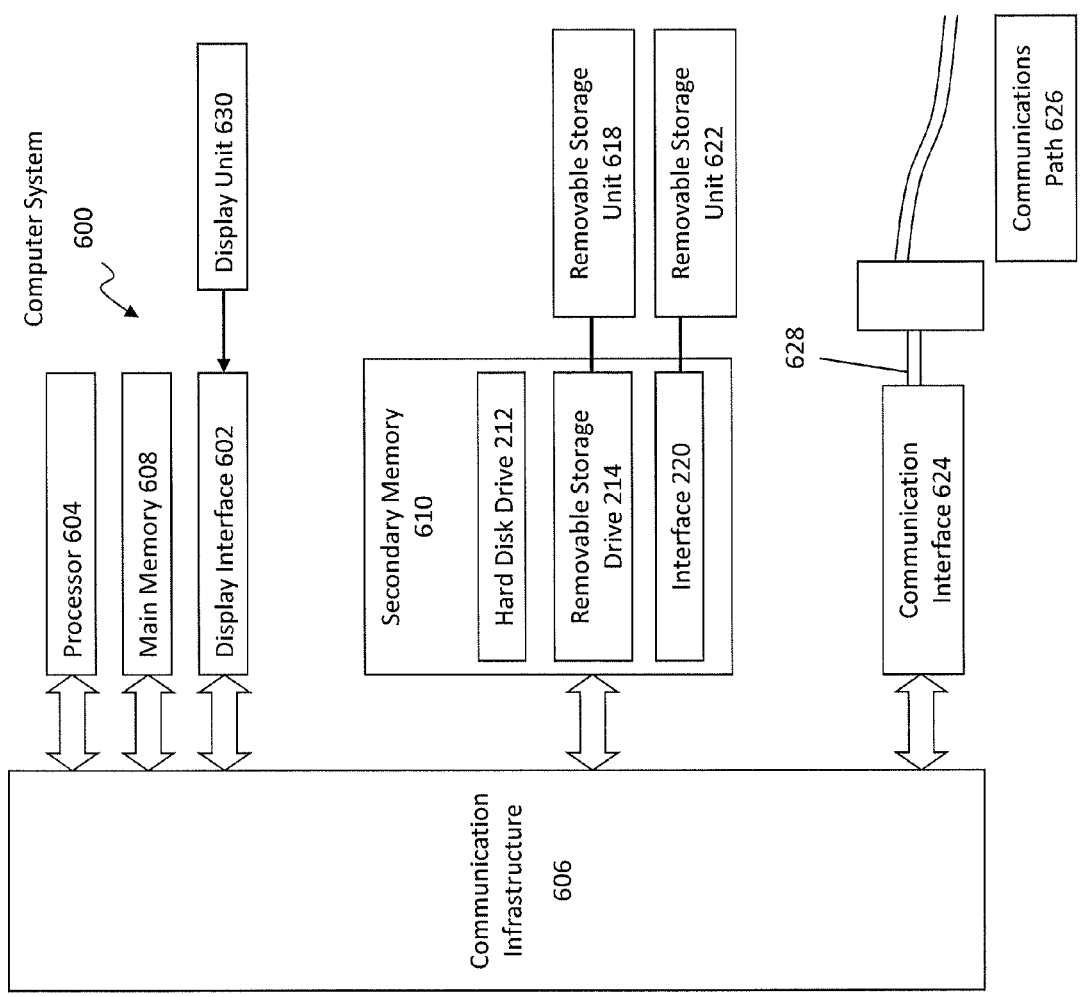
FIG. 6 depicts an example of a system diagram of various hardware components and other features, for use in accordance with aspects of the disclosure.

FIG. 6 presents an example system diagram of various hardware components and other features, for use in accordance with an aspect of the present invention. The present invention may be implemented using hardware, software, or a combination thereof and may be implemented in one or more computer systems or other processing systems. In one aspect, the invention is directed toward one or more computer systems capable of carrying out the functionality described herein. An example of such a computer system 600 is shown in FIG. 6.

Computer system 600 includes one or more processors, such as processor 604. The processor 604 is connected to a communication infrastructure 606 (e.g., a communications bus, cross-over bar, or network). Various software aspects are described in terms of this example computer system. After reading this description, it will become apparent to a person skilled in the relevant art(s) how to implement the invention using other computer systems and/or architectures.

Computer system 600 can include a display interface 602 that forwards graphics, text, and other data from the communication infrastructure 606 (or from a frame buffer not shown) for display on a display unit 630. Computer system 600 also includes a main memory 608, preferably random access memory (RAM), and may also include a secondary memory 610. The secondary memory 610 may include, for example, a hard disk drive 612 and/or a removable storage drive 614, representing a floppy disk drive, a magnetic tape drive, an optical disk drive, etc. The removable storage drive 614 reads from and/or writes to a removable storage unit 618 in a well-known manner. Removable storage unit 618, represents a floppy disk, magnetic tape, optical disk, etc., which is read by and written to removable storage drive 614. As will be appreciated, the removable storage unit 618 includes a computer usable storage medium having stored therein computer software and/or data.

In alternative aspects, secondary memory 610 may include other similar devices for allowing computer programs or other instructions to be loaded into computer system 600. Such devices may include, for example, a removable storage unit 622 and an interface 620. Examples of such may include a program cartridge and cartridge interface (such as that found in video game devices), a removable memory chip (such as an erasable programmable read only memory (EPROM), or programmable read only memory (PROM)) and associated socket, and other removable storage units 622 and interfaces 620, which allow software and data to be transferred from the removable storage unit 622 to computer system 600.

Computer system 600 may also include a communications interface 624. Communications interface 624 allows software and data to be transferred between computer system 600 and external devices. Examples of communications interface 624 may include a modem, a network interface (such as an Ethernet card), a communications port, a Personal Computer Memory Card International Association (PCMCIA) slot and card, etc. Software and data may be transmitted and transferred via communications interface 624 are in the form of signals 628, which may be electronic, electromagnetic, optical or other signals capable of being received by communications interface 624. These signals 628 are provided to communications interface 624 via a communications path (e.g., channel) 626. This path 626 carries signals 628 and may be implemented using wire or cable, fiber optics, a telephone line, a cellular link, a radio frequency (RF) link and/or other communications channels. In this document, the terms "computer program medium" and "computer usable medium" are used to refer generally to media such as a removable storage drive 680, a hard disk installed in hard disk drive 670, and signals 628. These computer program products provide software to the computer system 600. The invention is directed to such computer program products.

Computer programs (also referred to as computer control logic) are stored in main memory 608 and/or secondary memory 610. Computer programs may also be received via communications interface 624. Such computer programs, when executed, enable the computer system 600 to perform the features of the present invention, as discussed herein. In particular, the computer programs, when executed, enable the processor 610 to perform the features of the present invention. Accordingly, such computer programs represent controllers of the computer system 600.

In an aspect where the invention is implemented using software, the software may be stored in a computer program product and loaded into computer system 600 using removable storage drive 614, hard drive 612, or communications interface 620. The control logic (software), when executed by the processor 604, causes the processor 604 to perform the functions of the invention as described herein. In another aspect, the invention is implemented primarily in hardware using, for example, hardware components, such as application specific integrated circuits (ASICs). Implementation of the hardware state machine so as to perform the functions described herein will be apparent to persons skilled in the relevant art(s).

In yet another aspect, the invention is implemented using a combination of both hardware and software.

Figure 7:
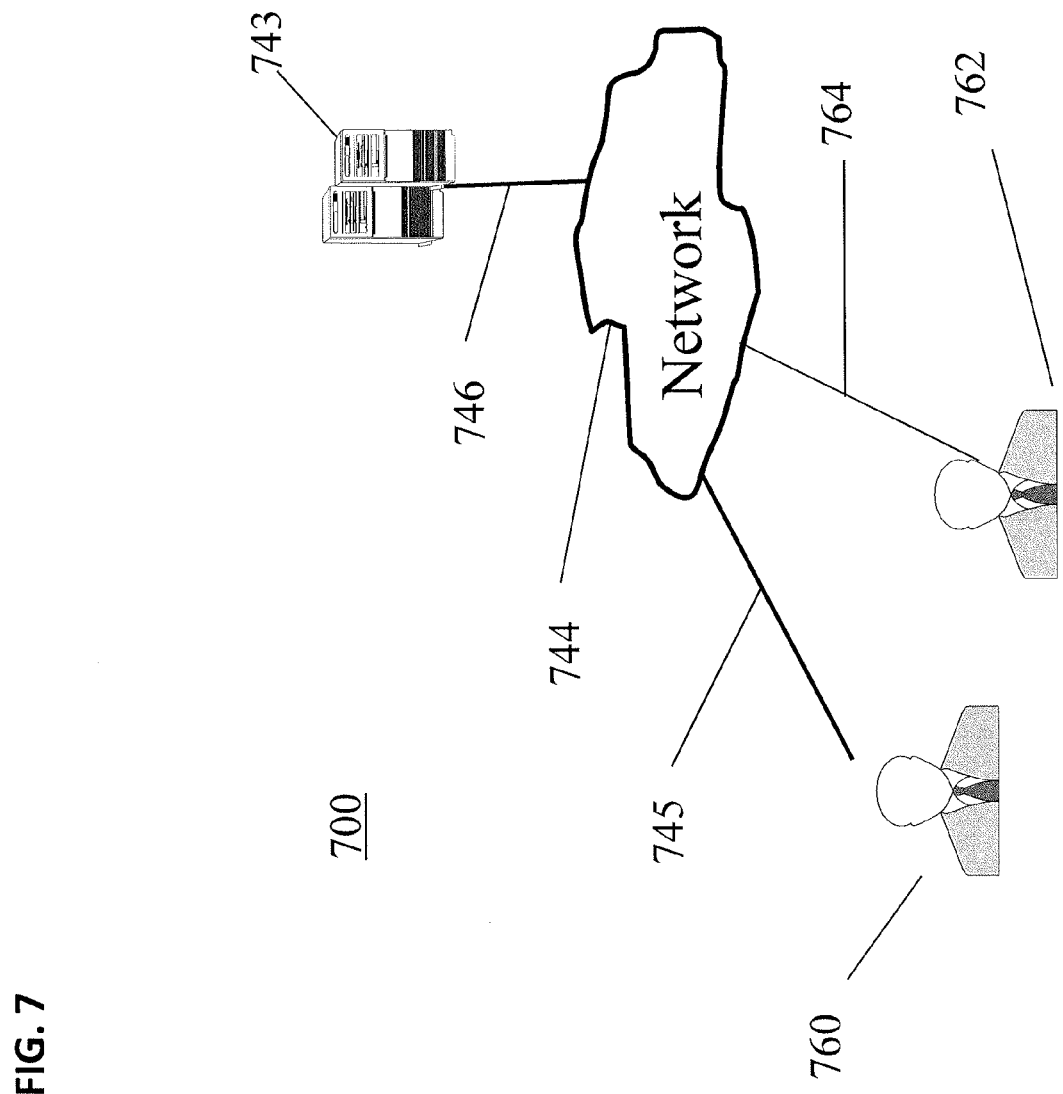
FIG. 7 is a block diagram of various example system components, in accordance with aspects of the disclosure.

FIG. 7 is a block diagram of various example system components, in accordance with an aspect of the present invention. FIG. 7 shows a communication system 700 usable in accordance with an aspect of the present invention. The communication system 700 includes one or more accessors 760, 762 (also referred to interchangeably herein as one or more "users") and one or more terminals 742, 766. In one aspect, data for use in accordance with the present invention is, for example, input and/or accessed by accessors 760, 764 via terminals 742, 766, such as personal computers (PCs), minicomputers, mainframe computers, microcomputers, telephonic devices, or wireless devices, such as personal digital assistants ("PDAs") or a hand-held wireless devices coupled to a server 743, such as a PC, minicomputer, mainframe computer, microcomputer, or other device having a processor and a repository for data and/or connection to a repository for data, via, for example, a network 744, such as the Internet or an intranet, and couplings 745, 746, 764. The couplings 745, 746, 764 include, for example, wired, wireless, or fiberoptic links. In another aspect, the method and system of the present invention operate in a stand-alone environment, such as on a single terminal.

The various illustrative logics, logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Additionally, at least one processor may comprise one or more modules operable to perform one or more of the steps and/or actions described above.

Further, the steps and/or actions of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an ASIC. Additionally, the ASIC may reside in a user terminal. In the alternative, the processor and the storage medium may reside as discrete components in a user terminal. Additionally, in some aspects, the steps and/or actions of a method or algorithm may reside as one or any combination or set of codes and/or instructions on a machine readable medium and/or computer readable medium, which may be incorporated into a computer program product.

In one or more aspects, the functions described may be implemented in hardware, software, firmware, or any combination thereof. If implemented in software, the functions may be stored or transmitted as one or more instructions or code on a computer-readable medium. Computer-readable media includes both computer storage media and communication media including any medium that facilitates transfer of a computer program from one place to another. A storage medium may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection may be termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs usually reproduce data optically with lasers. Combinations of the above should also be included within the scope of computer-readable media.

While the foregoing disclosure discusses illustrative aspects and/or embodiments, it should be noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

What is claimed is:

1. A method for site modeling, comprising:
   receiving data representing an existing site based on maps, surveyor data, photographs, and design plans of the existing site;
   analyzing, via a processing device, the data representing the existing site to determine an impact of building a new structure at the existing site;
   determining, via the processing device, a location of the new structure based on the analysis; and
   building, via the processing device, an interactive virtual model to visually present a representation of the existing site incorporating the new structure at the location, wherein the interactive model reflects a geography, time zone, and a time of day associated with the site;
   receiving, via the processing device, from a user, a selected time of day;
   presenting the interactive model showing conditions at the time of day, wherein the interactive model shows shadows associated with a location of the Sun at the selected time of day.

2. The method of claim 1, further comprising:
   associating one or more hyperlinks with one or more components of the interactive model, the hyperlinks including links to data about the one or more components.

3. The method of claim 1, further comprising:
   providing one or more avatars to represent one or more users of the interactive model;
   changing a view presented of the model as the avatar moves through the site.

4. The method of claim 1, wherein the site is a construction site, a city, or a town.

5. The method of claim 1, wherein building the model comprises:
   creating, based on the received data, a ground layer of the site;
   generating and placing representations of each structure on or near the site in the model; and
   generating and placing a representation of the new structure to be added to the site based on the results of the analysis.

6. An apparatus, comprising:
   a processor configured to:
      receive data representing an existing site, wherein the data comprises one or more of public geographic information systems data, private geographic information systems data, surveyor data, electronic maps, and photographs;
      analyze the data representing the existing site to determine an impact of building a new structure at the existing site;

determine a location of the new structure based on the analysis;

build an interactive virtual model to visually present a representation of the existing site incorporating the new structure at the location, wherein the interactive model reflects a geography, time zone, and a time of day associated with the site;

receive from a user, a selected time of day; and present the interactive model showing conditions at the time of day, wherein the interactive model shows shadows associated with a location of the Sun at the selected time of day; and a memory coupled to the processor.

7. The apparatus of claim 6, wherein the processor is further configured to:

associate one or more hyperlinks with one or more components of the interactive model, the hyperlinks including links to data about the one or more components.

8. The apparatus of claim 6, wherein the processor is further configured to:

provide one or more avatars to represent one or more users of the interactive model;

change a view presented of the model as the avatar moves through the site.

9. The apparatus of claim 6, wherein the site is a construction site, a city, or a town.

10. The apparatus of claim 6, wherein the processor is further configured to:

create, based on the received data, a ground layer of the site;

generate and place representations of each structure on or near the site in the model; and generate and place representations of the new structure to be added to the site based on the results of the analysis.

11. A non-transitory computer readable medium storing computer executable code comprising:

at least one set of codes for causing a computer to receive data representing an existing site, wherein the data comprises one or more of public geographic information systems data, private geographic information systems data, surveyor data, electronic maps, and photographs;

at least one set of codes for causing the computer to analyze the data representing the existing site to determine an impact of building a new structure at the existing site;

at least one set of codes for causing the computer to build an interactive virtual model to visually present a representation of the existing site incorporating the new structure at the location, wherein the interactive model reflects a geography, time zone, and a time of day associated with the site;

at least one set of codes for receiving, via the processing device, from a user, a selected time of day; and at least one set of codes for presenting the interactive model showing conditions at the time of day, wherein the interactive model shows shadows associated with a location of the Sun at the selected time of day.

12. The non-transitory computer readable medium of claim 11, wherein the non-transitory computer readable medium further comprises:

at least one set of codes for causing the computer to associate one or more hyperlinks with one or more components of the interactive model, the hyperlinks including links to data about the one or more components.

13. The non-transitory computer readable medium of claim 11 wherein the non-transitory computer readable medium further comprises:

at least one set of codes for causing the computer to provide one or more avatars to represent one or more users of the interactive model; and at least one set of codes for causing the computer to change a view presented of the model as the avatar moves through the site.

\* \* \* \* \*